United States Patent [19]

Dolan et al.

[11] 4,045,733

[45] Aug. 30, 1977

[54] MULTIPLEX CIRCUIT WITH TIME DELAY FOR STABILIZATION

[75] Inventors: Jerome J. Dolan, Evergreen Park; Roy R. Rosenberger, Wheaton, both of Ill.

[73] Assignee: Nalco Chemical Company, Oak Brook, Ill.

[21] Appl. No.: 702,845

[22] Filed: July 6, 1976

[51] Int. Cl.² ............... G01R 15/12; H04Q 1/20
[52] U.S. Cl. ............... 324/140 R; 324/30 R; 324/73 R; 340/150
[58] Field of Search ............ 324/30 R, 73 R, 73 AT, 324/99 D, 140 R, 140 D, 127; 340/150, 151, 183, 184; 328/162

[56] References Cited

U.S. PATENT DOCUMENTS

| | | | |
|---|---|---|---|
| 2,710,397 | 6/1955 | Foster | 324/99 D |
| 2,980,861 | 4/1961 | Popowsky | 324/140 R X |
| 3,256,492 | 6/1966 | Gilchrist | 324/66 UX |
| 3,258,692 | 6/1966 | Jacomini et al. | 324/140 R X |
| 3,341,816 | 9/1967 | Davis et al. | 324/140 R |
| 3,361,899 | 1/1968 | Massell et al. | 324/140 R X |
| 3,392,333 | 7/1968 | Blondfield | 324/140 R |

Primary Examiner—Gerard R. Strecker
Attorney, Agent, or Firm—Kinzer, Plyer, Dorn & McEachran

[57] ABSTRACT

A multiplex circuit for use with a plurality of measuring devices, each of which require a period of stabilization before providing an accurate measurement, includes a plurality of measuring stages. Each stage is connected in cascade to an adjacent stage and includes a measuring device, readout means and a timing circuit which activates the readout means a predetermined interval after the measuring device is turned on.

3 Claims, 1 Drawing Figure

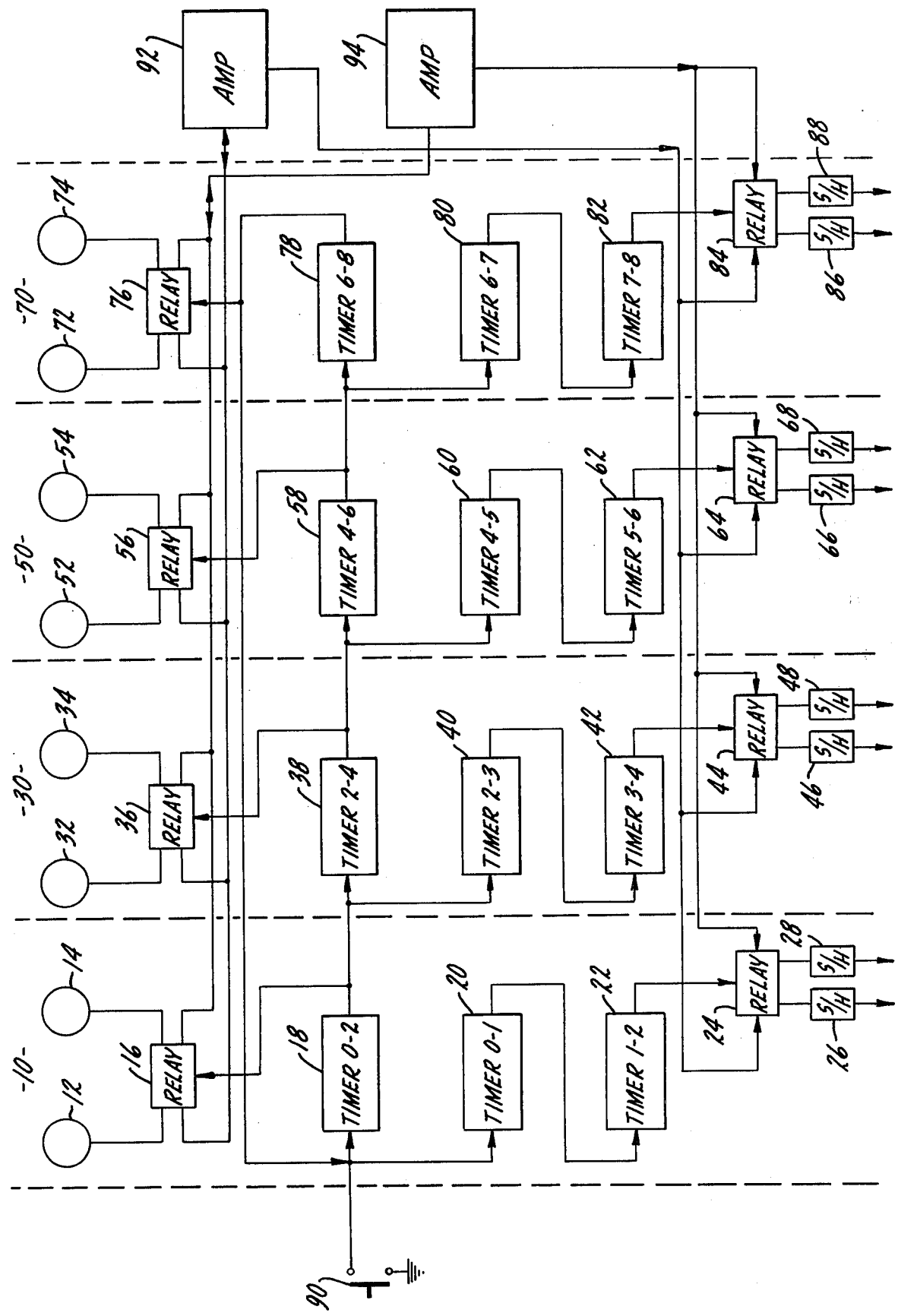

MULTIPLEX CIRCUIT WITH TIME DELAY FOR STABILIZATION

SUMMARY OF THE INVENTION

The present invention relates to a multiplex circuit having a plurality of measuring stages, connected in cascade, with each stage including a timing circuit for delaying readout of the measured quantity until stabilization of the measuring device has taken place.

Another purpose is a multiplex circuit for use in connection with measuring devices requiring a stabilization period before an accurate reading is provided.

Another purpose is a multiplex circuit of the type described including a plurality of timers so connected between the measuring device and the readout device as to delay turn-on of the readout device for a predetermined interval after turn-on of the measuring device.

Another purpose is a simply constructed reliably operable multiplex circuit for use with inductive measuring devices.

Another purpose is a multiplex circuit of the type described which may be arranged for use with any number of measuring stages.

Other purposes will appear in the ensuing specification, drawing and claims.

BRIEF DESCRIPTION OF THE DRAWING

The invention is illustrated diagrammatically in the attached schematic electrical diagram.

DESCRIPTION OF THE PREFERRED EMBODIMENT

The present invention has application in measuring the conductivity of washing solutions used in the manufacture of brown stock, an intermediate material generated in the manufacturing of kraft paper, for forming paper bags, cartons and other kraft paper products. The multiplex circuit described and claimed has substantially wider use. Specifically, the multiplex circuit has utility in conjunction with measuring devices which require a period of stabilization before accurate readings are provided.

In measuring the conductivity of washing solutions in the environment described, there may be a plurality of washing stages, with separate solutions used in each. The present multiplex circuit will be described in conjunction with four such stages in which there are a pair of conductivity probes measuring the conductivity of the solution at each stage.

In the drawing, the four measuring stages are indicated at 10, 30, 50 and 70. Each measuring stage includes a pair of conductivity probes designated respectively 12, 14; 32, 34; 52, 54; and 72, 74. In the specific example described, the inductive measuring probes have a toroidal construction and are of the type manufactured by Balsbaugh and known as the Balsbaugh 1210 EV and PN probes.

The designated probes are connected to relays 16, 36, 56 and 76 with each of the relays being connected to the output of the first of four timing circuits designated respectively 18, 38, 58 and 78. Each measuring stage includes three timers, and in addition to those designated above, there are timers 20 and 22 in stage 10, 40 and 42 in stage 30, 60 and 62 in stage 50, and 80 and 82 in stage 70. Each measuring stage is completed by relays designated respectively 24, 44, 64 and 84, with each relay having two outputs connected respectively to sample and hold circuits 26 and 28 for stage 10, 46 and 48 for stage 30, 66 and 68 for stage 50, and 86 and 88 for stage 70.

A start button for initiating the described sequence of operation for the multiplex circuit is indicated at 90 and a pair of amplifiers are indicated at 92 and 94. Amplifier 92, which operates in conjunction with probes 12, 32, 52 and 72, has an input-output connection to one side of relays 16, 36, 56 and 76, and an output connection to one side of relays 24, 44, 64 and 84. Similarly, amplifier 94, which operates in conjunction with probes 14, 34, 54 and 74, has an input-output connection to one side of relays 16, 36, 56 and 76, and an output connection to one side of relays 24, 44, 64 and 84.

As each of the measuring stages operates in an identical manner, and in sequence, only the operation of one stage will be described in detail.

Each of the timing circuits operate for specified time intervals. The circuits are turned on by an applied negative voltage transition and will be turned off after a predetermined interval as described. When start button 90 is closed, a negative voltage transition is applied to the inputs of timers 18 and 20. Timer 18 will remain on for two seconds, whereas, timer 20 will remain on for one second. When timer 18 is turned on, it will cause activation of probes 12 and 14 by closing relay 16, thus providing an applied voltage from amplifiers 92 and 94 to probes 12 and 14, respectively. Timer 20 will time out after one second, with the result that a negative transition will be applied to the input of timer 22 which will then remain on for a one second interval which is the last half of the total two second timing interval of measuring stage 10. When timer 22 is turned on it will close relay 24 thereby causing the measured voltage from probes 12 and 14 to be processed through amplifiers 92 and 94 to sample and hold circuits 26 and 28. As is known in the art, the sample and hold circuit will provide an analog indication of the amplifier reading at the end of the timing period. Thus, for the two second operating interval of stage 10, probes 12 and 14 have a one second stabilization period before the readings, as amplified, are applied through relay 24 to sample and hold circuits 26 and 28. The sample and hold circuits will provide the analog reading to whatever readout and calculating circuitry is necessary for the particular application. What is important herein is the multiplex circuit itself and the timing arrangement whereby there is a stabilization period provided for the actual measuring device.

At the conclusion of the two second interval for stage 10, the negative transition from timer 18 is applied to stage 30 timers 38 and 40. The process is repeated for stage 30 and the operation of timers 38, 40 and 42 will be the same as described in connection with timers 18, 20 and 22. In like manner, stages 50 and 70 will provide for the operation of their conductive probes, at prescribed periods successively following the operation of stages 10 and 30. When timer 78 completes its two second timing interval, it will provide a reset signal to the input of timers 18 and 20 with the result that the entire measuring operation is repeated. The repetition period is eight seconds in the described example, although the invention should not be limited to any particular timing interval. In like manner, the invention should not be limited to equal stabilization and measure intervals.

Amplifiers 92 and 94 are common for all of the measuring stages. There may be additional measuring stages as the amplifiers are successively switched, by the relays, from one stage to the next, as the stages are independently and successively activated or turned on. The timing circuits for each stage are identical. One timer is operated for the entire interval of the stage, whereas, the other two timers provide for a stabilization period and a reading period subsequent thereto.

Whereas the preferred form of the invention has been shown and described herein, it should be realized that there may be many modifications, substitutions and alterations thereto.

The embodiments of the invention in which an exclusive property or privilege is claimed are defined as follows:

1. A multiplex circuit for use with a plurality of measuring means which require a period of stabilization after activation, said circuit including a plurality of measuring stages, each stage having at least one measuring means, readout means and timing means, said timing means including first, second and third timers, said first and second timers having a common input with the output of said first timer being connected to a measuring means, the output of said second timer being connected to the input of said third timer, with the output of said third timer being connected to a readout means, the elapsed operating time of said first timer being equal to the sum of the operating times for said second and third timers, with said second timer activating said third timer a predetermined interval after turn-on of said first and second timers, said measuring stages being connected in cascade, with the timing means of one stage being connected to activate the timing means of the successive stage.

2. The multiplex circuit of claim 1 further characterized by and including amplifier means connected in common between all of said measuring means and all of said readout means.

3. The circuit of claim 1 further characterized in that each of said readout means includes a relay and at least one output circuit, a common amplifier connected to all of said relays and to all of said measuring means.

* * * * *